US009984906B2

(12) United States Patent
Matsumoto et al.

(10) Patent No.: US 9,984,906 B2
(45) Date of Patent: May 29, 2018

(54) PLASMA PROCESSING DEVICE AND PLASMA PROCESSING METHOD

(71) Applicant: TOKYO ELECTRON LIMITED, Tokyo (JP)

(72) Inventors: Naoki Matsumoto, Miyagi (JP); Yugo Tomita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 168 days.

(21) Appl. No.: 14/396,606

(22) PCT Filed: May 21, 2013

(86) PCT No.: PCT/JP2013/064114
§ 371 (c)(1),
(2) Date: Oct. 23, 2014

(87) PCT Pub. No.: WO2013/176144
PCT Pub. Date: Nov. 28, 2013

(65) Prior Publication Data
US 2015/0064923 A1     Mar. 5, 2015

(30) Foreign Application Priority Data

May 25, 2012   (JP) ................................ 2012-119619

(51) Int. Cl.
*H01J 37/32*     (2006.01)
*H01L 21/3065*   (2006.01)
*H01L 21/67*     (2006.01)

(52) U.S. Cl.
CPC .. *H01L 21/67069* (2013.01); *H01J 37/32192* (2013.01); *H01J 37/32238* (2013.01);
(Continued)

(58) Field of Classification Search
CPC ....... C23C 16/511; H01J 37/32192-37/32311; H01J 37/32522; H01J 37/32743;
(Continued)

(56) References Cited

U.S. PATENT DOCUMENTS 3,664,942 A * 5/1972 Havas ............... H01J 37/32935
204/192.33
5,846,331 A * 12/1998 Miyamoto ............ H01J 37/321
118/723 I
(Continued)

FOREIGN PATENT DOCUMENTS

| JP | 9-172003 A | 6/1997 |
|----|------------|--------|
| JP | 2005-244065 A | 9/2005 |
| JP | 2010-219198 A | 9/2010 |

OTHER PUBLICATIONS

International Search Report dated Aug. 27, 2013 in PCT/JP2013/064114.

*Primary Examiner* — Benjamin Kendall
(74) *Attorney, Agent, or Firm* — Rothwell, Figg, Ernst & Manbeck, P.C.

(57) ABSTRACT

A plasma processing device includes a processing chamber defining a plasma processing space and a stage for mounting thereon a target substrate in the processing chamber. The plasma processing device further includes a gas supply mechanism for introducing a processing gas into the plasma processing space, a plasma generation mechanism for supplying electromagnetic energy into the plasma processing space, and a control unit configured to, if a command to start a plasma process for the target substrate mounted on a substrate carry-in stage is issued, perform a warm-up process for supplying the processing gas into the plasma processing space by the gas supply mechanism and supply-
(Continued)

ing the electromagnetic energy by the plasma generation mechanism in a state where no target substrate is mounted on the stage.

9 Claims, 13 Drawing Sheets

(52) U.S. Cl.
CPC .. *H01J 37/32522* (2013.01); *H01J 37/32743* (2013.01); *H01J 37/32917* (2013.01); *H01J 37/32935* (2013.01); *H01L 21/67248* (2013.01); *H01L 21/3065* (2013.01)

(58) Field of Classification Search
CPC ........... H01J 37/32899; H01J 37/32917; H01J 37/32935; H01J 37/32954; H01J 37/3299; H01L 21/3065; H01L 21/67069; H01L 21/67248; H05H 2001/4607–2001/4637
See application file for complete search history.

(56) References Cited

U.S. PATENT DOCUMENTS

| | | | | |
|---|---|---|---|---|
| 5,925,212 A * | 7/1999 | Rice | ................. | H01J 37/32871 156/345.27 |
| 5,990,017 A * | 11/1999 | Collins | ............. | H01L 21/31116 216/67 |
| 6,736,930 B1 * | 5/2004 | Hongoh | ............ | H01J 37/32192 118/723 MW |
| 2002/0100557 A1 * | 8/2002 | Li | ......................... | H01J 37/321 156/345.48 |
| 2004/0118520 A1 * | 6/2004 | Nakayama | ........ | H01J 37/32522 156/345.41 |
| 2005/0148167 A1 * | 7/2005 | Hongoh | ............ | H01J 37/32192 438/623 |
| 2005/0189070 A1 | 9/2005 | Tanaka et al. | | |
| 2005/0227500 A1 * | 10/2005 | Sugawara | ............. | C23C 16/511 438/785 |
| 2007/0113788 A1 * | 5/2007 | Nozawa | ............ | H01J 37/32192 118/723 MW |
| 2007/0163502 A1 * | 7/2007 | Nozawa | ............... | C23C 16/4411 118/723 R |
| 2007/0281083 A1 | 12/2007 | Lakshmanan et al. | | |
| 2011/0048642 A1 * | 3/2011 | Mihara | ............. | H01J 37/32192 156/345.34 |
| 2011/0108195 A1 * | 5/2011 | Nishimoto | ........ | H01J 37/32192 156/345.37 |
| 2011/0168673 A1 * | 7/2011 | Nishimoto | ........ | H01J 37/32192 216/67 |
| 2011/0303641 A1 * | 12/2011 | Mahadeswaraswamy | ......................... | H01J 37/32522 216/67 |
| 2012/0064726 A1 * | 3/2012 | Nozawa | ............ | H01J 37/32192 438/710 |

* cited by examiner

PLASMA PROCESSING DEVICE AND PLASMA PROCESSING METHOD

CROSS REFERENCE TO RELATED APPLICATION

This application is a 35 U.S.C. 371 National Phase Entry Application from PCT/JP2013/064114, filed May 21, 2013, which claims priority to Japanese Patent Application No. 2012-119619, filed May 25, 2012, the disclosures of which are incorporated herein in their entirety by reference.

TECHNICAL FIELD

Various aspects and embodiments of the present invention relate to a plasma processing device and a plasma processing method.

BACKGROUND ART

In a semiconductor manufacturing process, there is widely used a plasma processing device that performs a plasma process for the purpose of depositing or etching a thin film. Examples of the plasma processing device include a plasma CVD (Chemical Vapor Deposition) device for performing a thin film deposition process and a plasma etching device for performing an etching process.

The plasma processing device includes a processing chamber for processing a target substrate, a stage on which the target substrate is mounted in the processing chamber, a gas supply system for introducing a processing gas required in a plasma reaction into the processing chamber, and so forth. The plasma processing device further includes a plasma generation mechanism for supplying electromagnetic energy such as microwaves or RF waves into the processing chamber to convert the processing gas in the processing chamber to plasma, a voltage applying mechanism for applying a bias voltage to the target stage and accelerating ions in the plasma toward the target substrate mounted on the target stage, and so forth.

In the plasma processing device, due to the variations in the inner surface temperature of the processing chamber, it is sometimes the case that the processing accuracy of target substrates varies even if a plasma process is repeated under the same processing condition. Description will be made by taking a plasma etching device as an example. For example, if a plasma etching process is performed after a lapse of a period of time from when a previous plasma etching process is performed, there may be a case where the etching rate of the first target substrate of an initial lot (the first lot) becomes lower than the etching rate of a subsequent target substrate. Presumably, this is because the temperature of the inner surface of the processing chamber is decreased due to the leaving a certain amount of time after the execution of a previous plasma etching process and because the next plasma etching process is performed in that state.

In the related art, as a solution to this problem, there is known a method in which, as disclosed in Patent Document 1, seasoning is carried out prior to performing a plasma process for the target substrates of the first lot. The seasoning means that the temperature of the inner surface of the processing chamber is increased by loading a dummy wafer on a stage and performing a plasma generating process before a plasma process for the first lot is performed. After the temperature of the inner surface of the processing chamber is increased, a normal plasma process is performed. According to this method, it is presumably possible to prevent a decrease in the etching rate even when the target substrate of the first lot are processed after the temperature of the inner surface of the processing chamber is decreased.

RELATED ART DOCUMENTS

Patent Documents

Patent Document 1: Japanese Patent Application Publication No. 2005-244065

SUMMARY OF THE INVENTION

Problems to be Solved

However, in the related art, by virtue of the seasoning process, the dummy wafer is loaded and the plasma process is performed prior to processing the target substrates of the first lot. Therefore, the number of target substrates processed per unit time is reduced. For that reason, in the related art, it is difficult to suppress a reduction in the etching rate of target substrates of the first lot while suppressing a reduction in the throughput of a plasma process of target substrates.

Means for Solving the Problems

A plasma processing device in accordance with an aspect of the present invention includes a processing chamber configured to define a plasma processing space, and a substrate mounting stage provided within the processing chamber such that a target substrate is mounted on the substrate mounting stage. The plasma processing device further includes a gas supply mechanism configured to introduce a processing gas to be used in a plasma reaction into the plasma processing space, and a plasma generation mechanism configured to supply electromagnetic energy for converting the processing gas introduced into the plasma processing space to plasma. Furthermore, the plasma processing device includes a control unit configured to, if a command to start a plasma process for the target substrate mounted on a substrate carry-in stage outside the processing chamber is issued and the target substrate is to be transferred from the substrate carry-in stage into the processing chamber, perform a warm-up process for supplying the processing gas into the plasma processing space by the gas supply mechanism and supplying the electromagnetic energy by the plasma generation mechanism in a state where no target substrate is mounted on the substrate mounting stage.

Effects of the Invention

According to various aspects and embodiments of the present invention, it is possible to realize a plasma processing device and a plasma processing method which are capable of suppressing a reduction in the etching rate of target substrates of the first lot while suppressing a reduction in the throughput of a plasma process of target substrates.

EMBODIMENTS OF THE INVENTION

Embodiments will now be described with reference to the drawings. In the respective drawings, identical or equivalent parts will be designated by like reference symbols.

Figure 1:
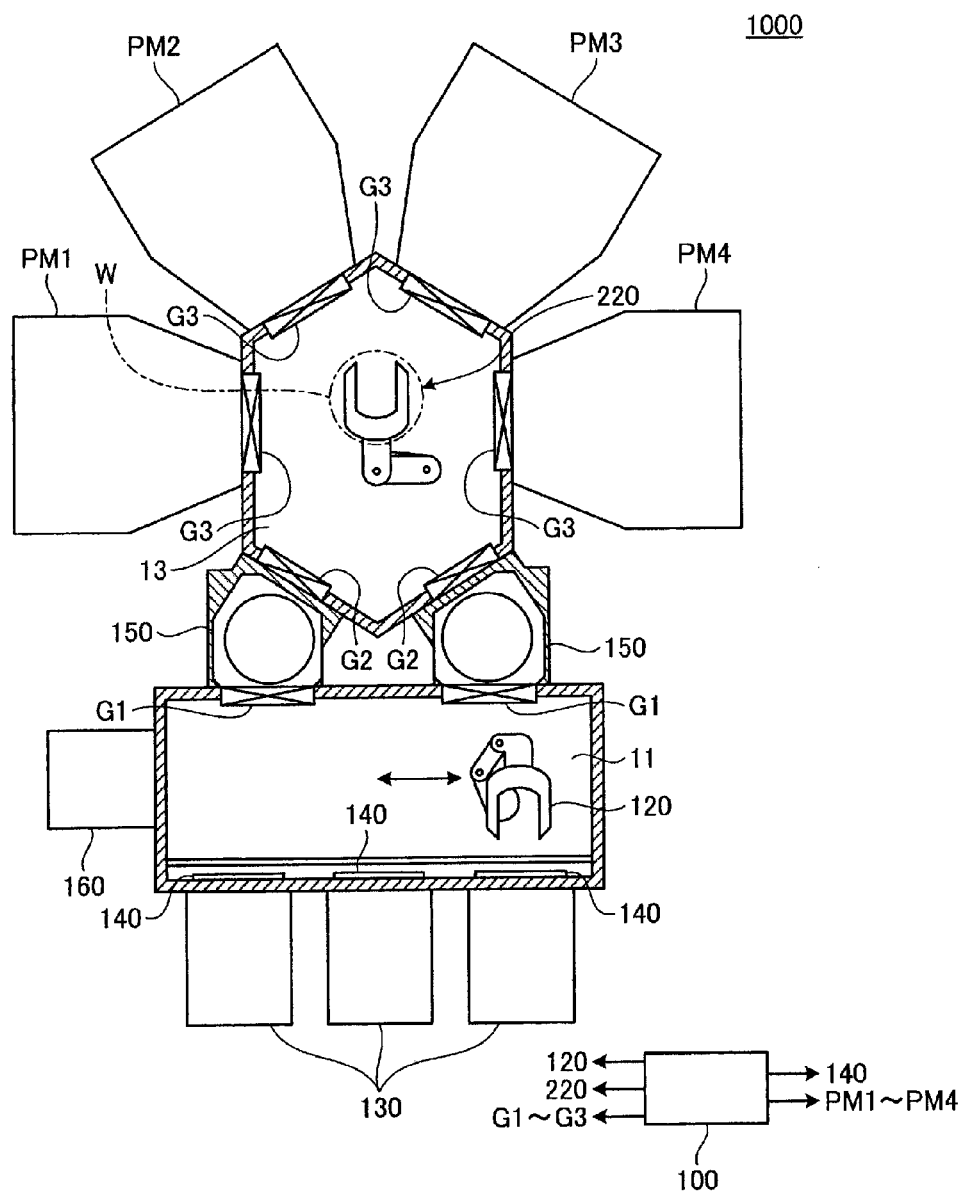
FIG. 1 is a view schematically showing a plasma processing system according to an embodiment.

FIG. 1 is a view schematically showing a plasma processing system according to an embodiment. As shown in FIG. 1, the plasma processing system 1000 according to the embodiment includes an atmospheric transfer chamber 11, loading and unloading ports 130, load-lock chambers 150 and an alignment module 160. The plasma processing system 1000 further includes a vacuum transfer chamber 13, a plurality of plasma processing devices PM1 to PM4 and a control unit 100.

The atmospheric transfer chamber 11 is a rectangular parallelepiped transfer container which is kept under an atmospheric pressure and which is designed to transfer a target substrate W placed in each of the loading and unloading ports 130 to, e.g., the plasma processing device PM1. Within the atmospheric transfer chamber 11, there is provided a transfer mechanism 120 which includes a rotatable, extendable and retractable transfer arm for delivering the target substrate W between the loading and unloading ports 130, the alignment module 160 and the load-lock chambers 150. A plurality of (three, in the embodiment) loading and unloading ports 130 is arranged side by side along one long-side sidewall of the atmospheric transfer chamber 11. The loading and unloading ports 130 are connected to one long-side sidewall of the atmospheric transfer chamber 11 through doors 140. Each of the loading and unloading ports 130 includes a FOUP (Front Opening Unified Pod) for accommodating target substrates W which have not yet been subjected to a plasma process.

A plurality of (two, in the embodiment) load-lock chambers 150 is arranged side by side along the other long-side sidewall of the atmospheric transfer chamber 11. The load-lock chambers 150 are preliminary vacuum chambers which are connected to the other long-side sidewall of the atmospheric transfer chamber 11 through gate valves G1 and which are designed to deliver the target substrate W kept under an atmospheric pressure to the vacuum transfer chamber 13 kept under a vacuum pressure. The alignment module 160 is provided on one short-side sidewall of the atmospheric transfer chamber 11. The alignment module 160 includes an orientor for adjusting the position of the target substrate W.

The vacuum transfer chamber 13 is a container for transferring the target substrate W. The vacuum transfer chamber 13 has a hexagonal shape when seen in a plane view. The vacuum transfer chamber 13 is maintained in a vacuum atmosphere by virtue of a vacuum pump not shown. The load-lock chambers 150 are connected to the sidewalls of two sides of the vacuum transfer chamber 13 through gate valves G2. The plasma processing devices PM1 to PM4 are connected to the sidewalls of the remaining four sides of the vacuum transfer chamber 13 through gate valves G3. Within the vacuum transfer chamber 13, there is provided a transfer mechanism 220 which includes a rotatable, extendable and retractable transfer arm for delivering the target substrate W between the load-lock chambers 150 and the plasma processing devices PM1 to PM4.

The control unit 100 may be, e.g., a computer which includes a central processing unit (CPU) and a storage device such as a memory or the like. The control unit 100 outputs various kinds of control signals according to programs and process recipes stored in the storage device. The control unit 100 controls, e.g., transfer of the target substrate W, opening and closing of the respective gate valves G1 to G3 and the doors 140, processes performed in the respective plasma processing devices PM1 to PM4, a warm-up process, and the inter-lot warm-up process. The various kinds of control signals outputted from the control unit 100 are inputted to the transfer mechanisms 120 and 220, the respective gate valves G1 to G3, the doors 140 and the plasma processing devices PM1 to PM4. Details of the warm-up process and the inter-lot warm-up process executed by the control unit 100 will be described later.

Next, the configuration of the plasma processing devices PM1 to PM4 according to the embodiment will be described. In the present embodiment, description will be made by taking, as an example, a case where all the plasma processing devices PM1 to PM4 are plasma etching devices. However, the present invention is not limited thereto. In the following description, the plasma processing device PM1 will be representatively described. It should be appreciated that the plasma processing devices PM2 to PM4 have the same configuration as the plasma processing device PM1.

Figure 2:
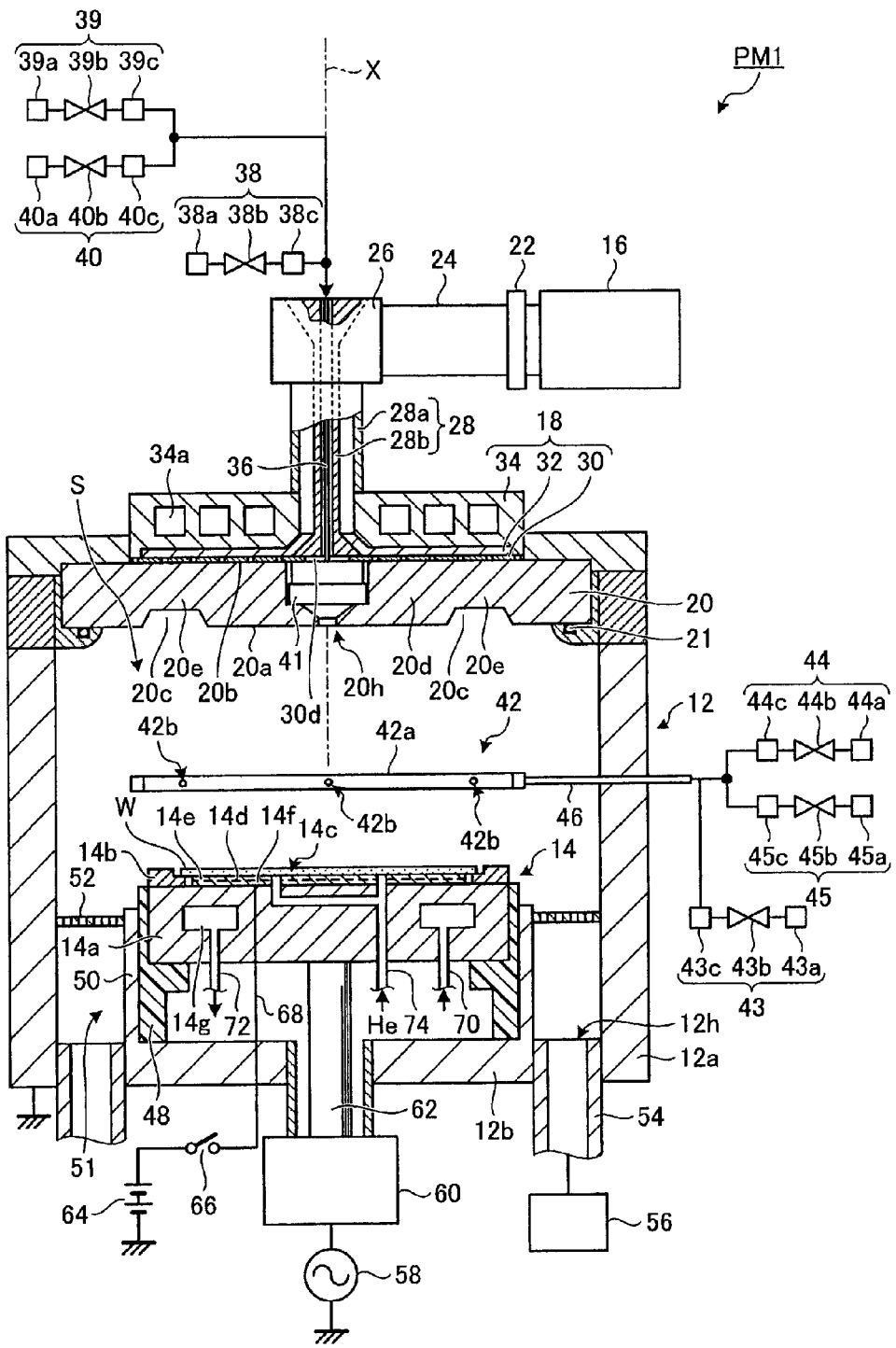
FIG. 2 is a view schematically showing a plasma processing device according to the embodiment.

FIG. 2 is a view schematically showing the plasma processing device according to the embodiment. The plasma processing device PM1 shown in FIG. 2 includes a processing chamber 12, a stage 14, a microwave generator 16, an antenna 18 and a dielectric window 20.

The processing chamber 12 defines a processing space S for performing a plasma process. The processing chamber 12 includes a sidewall 12a and a bottom portion 12b. The sidewall 12a is formed into a substantially tubular shape. In the following description, an axis X vertically extending through the center of the tubular sidewall 12a will be imaginarily set and the extension direction of the axis X will be referred to as an axis X direction. The bottom portion 12b is provided at the lower end side of the sidewall 12a to cover the bottom side opening of the sidewall 12a. An exhaust hole 12h for exhausting a gas is provided in the bottom portion 12b. The upper end portion of the sidewall 12a is opened.

The upper end opening of the sidewall 12a is closed by the dielectric window 20. An O-ring 21 is interposed between the dielectric window 20 and the upper end portion of the sidewall 12a. The dielectric window 20 is provided in the upper end portion of the sidewall 12a with the O-ring 21 interposed therebetween. The sealing of the processing chamber 12 is made more reliable by the O-ring 21. The stage 14 is accommodated within the processing space S. A target substrate W is mounted on the stage 14. The dielectric window 20 has a facing surface 20a that faces the processing space S.

The microwave generator 16 generates a microwave of, e.g., 2.45 GHz. In the embodiment, the plasma processing device PM1 further includes a tuner 22, a waveguide 24, a mode transducer 26 and a coaxial waveguide 28.

The microwave generator 16 is connected to the waveguide 24 through the tuner 22. The waveguide 24 is, e.g., a rectangular waveguide. The waveguide 24 is connected to the mode transducer 26 which is connected to the upper end of the coaxial waveguide 28.

The coaxial waveguide 28 extends along the axis X. The coaxial waveguide 28 includes an outer conductor 28a and an inner conductor 28b. The outer conductor 28a extends in the axis X direction and has a substantially cylindrical shape. The inner conductor 28b is provided within the outer conductor 28a. The inner conductor 28b extends in the axis X direction and has a substantially cylindrical shape.

The microwave generated by the microwave generator 16 is guided to the mode transducer 26 through the tuner 22 and the waveguide 24. The mode transducer 26 converts the mode of the microwave and supplies the mode-converted microwave to the coaxial waveguide 28. The microwave is supplied from the coaxial waveguide 28 to the antenna 18.

The antenna 18 emits a plasma-exciting microwave based on the microwave generated by the microwave generator 16. The antenna 18 includes a slot plate 30, a dielectric plate 32 and a cooling jacket 34. The antenna 18 is provided on the opposite surface 20b of the dielectric window 20 to the facing surface 20a. Based on the microwave generated by the microwave generator 16, the antenna 18 emits the plasma-exciting microwave toward the processing space S through the dielectric window 20. The microwave generator 16 and the antenna 18 constitute a plasma generation mechanism that supplies electromagnetic energy for converting a processing gas introduced into the processing space S to plasma.

The slot plate 30 is formed into a substantially disc-like shape with the surface thereof being orthogonal to the axis X. The slot plate 30 is disposed on the opposite surface 20b of the dielectric window 20 from the facing surface 20a with the surface of the slot plate 30 making contact with the dielectric window 20. In the slot plate 30, a plurality of slots 30a is circumferentially arranged about the axis X.

Figure 3:
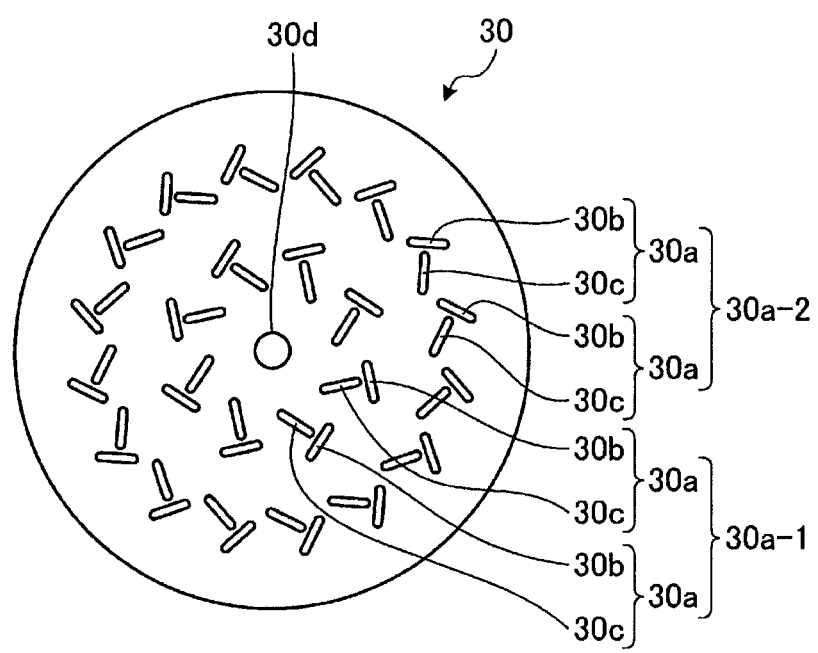
FIG. 3 is a plan view of a slot plate according to the embodiment, which is viewed in an axis X direction.

FIG. 3 is a plan view of the slot plate according to the embodiment, which is viewed in the axis X direction. In the embodiment, as shown in FIG. 3, the slot plate 30 is a slot plate that constitutes a radial line slot antenna. The slot plate 30 is made of an electrically conductive metal and has a disc shape. A plurality of slots 30a is formed in the slot plate 30. Each of the slots 30a includes a slot 30b and a slot 30c as elongated holes which extend in the mutually intersecting or orthogonal directions. The slots 30a are disposed at a specified interval in the radial direction and at a specified interval in the circumferential direction.

In other words, the slots 30a include a first slot group 30a-1 in which the slots 30a are formed along the circumferential direction of the slot plate 30 and a second slot group 30a-2 which is positioned radially outward of the first slot group 30a-1 and in which the slots 30a are formed along the circumferential direction of the slot plate 30. A through-hole 30d through which a conduit 36 to be described later passes is formed in the central portion of the slot plate 30.

Referring again to FIG. 2, the dielectric plate 32 is formed into a substantially disc-like shape with the surface thereof being orthogonal to the axis X. The dielectric plate 32 is provided between the slot plate 30 and the lower surface of the cooling jacket 34. The dielectric plate 32 is made of, e.g., quartz, and has a substantially disc-like shape. The dielectric window 20 has an annular recess portion 20c formed between a disc-like central portion and an outer peripheral portion of the facing surface 20a which faces the processing space S. Thus, the dielectric window includes a thick portion 20d formed in the disc-like central portion and a thin portion 20e formed between the disc-like central portion and the outer peripheral portion.

The surface of the cooling jacket 34 is electrically conductive. The cooling jacket 34 has a flow path 34a formed within the cooling jacket 34 such that a coolant can circulate through the flow path 34a. The dielectric plate 32 and the slot plate 30 are cooled by the circulation of the coolant. The lower end of the outer conductor 28a is electrically connected to the upper surface of the cooling jacket 34. The lower end of the inner conductor 28b is electrically connected to the slot plate 30 through the holes formed in the central portions of the cooling jacket 34 and the dielectric plate 32.

The microwave is propagated from the coaxial waveguide to the dielectric plate 32 and is introduced from the slots 30a of the slot plate 30 into the processing space S through the dielectric window 20. In the embodiment, a conduit 36 extends through the internal hole of the inner conductor 28b of the coaxial waveguide 28. A through-hole 30d through which the conduit 36 passes is formed in the central portion of the slot plate 30. The conduit 36, which extends along the axis X, is connected to gas supply systems 38, 39 and 40.

The gas supply system 38 supplies a processing gas for processing a target substrate W to the conduit 36. The processing gas supplied by the gas supply system 38 includes a fluorine-based gas. In the embodiment, the processing gas is an etching gas, e.g., $CF_4$ gas or $CH_2F_2$ gas. The gas supply system 38 may include a gas source 38a, a valve 38b and a flow rate controller 38c. The gas source 38a is a supply source of the processing gas. The valve 38b switches the supply and the cutoff of the processing gas supplied from the gas source 38a. The flow rate controller 38c is, e.g., a mass flow controller. The flow rate controller 38c controls the flow rate of the processing gas supplied from the gas source 38a.

The gas supply system 39 supplies a processing gas for processing a target substrate W to the conduit 36. The processing gas supplied by the gas supply system 39 includes oxygen gas ($O_2$ gas). The gas supply system 39 may include a gas source 39a, a valve 39b and a flow rate controller 39c. The gas source 39a is a supply source of the oxygen gas. The valve 39b switches the supply and the cutoff of the processing gas supplied from the gas source 39a. The flow rate controller 39c is, e.g., a mass flow controller. The flow rate controller 39c controls the flow rate of the processing gas supplied from the gas source 39a.

The gas supply system 40 supplies argon gas to the conduit 36. In the embodiment, in addition to the processing gas supplied from the gas supply system 39, argon gas is supplied from the gas supply system 40. The gas supply system 40 may include a gas source 40a, a valve 40b and a flow rate controller 40c. The gas source 40a is a supply source of the argon gas. The valve 40b switches the supply and the cutoff of the argon gas supplied from the gas source 40a. The flow rate controller 40c is, e.g., a mass flow controller. The flow rate controller 40c controls the flow rate of the argon gas supplied from the gas source 40a. The gas supply systems 38, 39 and 40 constitute a gas supply mechanism for introducing processing gases to be used in a plasma reaction into the processing space S.

In the embodiment, the plasma processing device PM1 may further include an injector 41. The injector 41 supplies a gas from the conduit 36 to a through-hole 20h formed in the dielectric window 20. The gas supplied to the through-hole 20h of the dielectric window 20 is introduced into the processing space S. In the following description, a gas supply route defined by the conduit 36, the injector 41 and the through-hole 20h will be sometimes referred to as a "central gas introduction part".

In the embodiment, the plasma processing device PM1 may further include a gas supply unit 42. The gas supply unit 42 is provided between the stage 14 and the dielectric window 20 to supply, a gas from the periphery of the axis X to the processing space S. In the following description, the gas supply unit 42 will be sometimes referred to as a "peripheral gas introduction part". The gas supply unit 42 includes a conduit 42a. The conduit 42a is provided between the dielectric window 20 and the stage 14 to annularly extend about the axis X. A plurality of gas supply holes 42b is formed in the conduit 42a. The gas supply holes 42b are annularly arranged and are opened toward the axis X such that the gas supplied into the conduit 42a is supplied toward the axis X. The gas supply unit 42 is connected to gas supply systems 43, 44 and 45 through a conduit 46.

The gas supply system 43 supplies a processing gas for processing a target substrate W to the gas supply unit 42. The processing gas supplied from the gas supply system 43 includes a fluorine-based gas which is the same as the processing gas of the gas supply system 38. In the embodiment, the processing gas is an etching gas, e.g., $CF_4$ gas or $CH_2F_2$ gas. The gas supply system 43 may include a gas source 43a, a valve 43b and a flow rate controller 43c. The gas source 43a is a supply source of the processing gas. The valve 43b switches the supply and the cutoff of the processing gas supplied from the gas source 43a. The flow rate controller 43c is, e.g., a mass flow controller. The flow rate controller 43c controls the flow rate of the processing gas supplied from the gas source 43a.

The processing gas supplied by the gas supply system 44 includes oxygen gas which is the same as the processing gas of the gas supply system 39. The gas supply system 44 supplies the processing gas including oxygen gas ($O_2$ gas) to the gas supply unit 42. The gas supply system 44 may include a gas source 44a, a valve 44b and a flow rate controller 44c. The gas source 44a is a supply source of the oxygen gas. The valve 44b switches the supply and the cutoff of the processing gas supplied from the gas source 44a. The flow rate controller 44c is, e.g., a mass flow controller. The flow rate controller 44c controls the flow rate of the processing gas supplied from the gas source 44a.

The gas supply system 45 supplies argon gas to the gas supply unit 42. In the embodiment, in addition to the processing gas supplied from the gas supply system 44, argon gas is supplied from the gas supply system 45. The gas supply system 45 may include a gas source 45a, a valve 45b and a flow rate controller 45c. The gas source 45a is a supply source of the argon gas. The valve 45b switches the supply and the cutoff of the argon gas supplied from the gas source 45a. The flow rate controller 45c is, e.g., a mass flow controller. The flow rate controller 45c controls the flow rate of the argon gas supplied from the gas source 45a. The gas supply systems 43, 44 and 45 constitute a gas supply mechanism for introducing processing gases used in a plasma reaction into the processing space S.

The stage 14 is provided to face the dielectric window 20 in the axis X direction. The stage 14 is provided such that the processing space S exists between the dielectric window 20 and the stage 14. A target substrate W is mounted on the stage 14. In the embodiment, the stage 14 includes a stand 14a, a focus ring 14b and an electrostatic chuck 14c.

The stand 14a is supported by a tubular support 48. The tubular support 48 is made of an insulating material. The tubular support 48 extends vertically upward from the bottom portion 12b. An electrically-conductive tubular support portion 50 is provided around the tubular support 48. The tubular support portion 50 extends vertically upward from the bottom portion 12b of the processing chamber 12 along the outer circumference of the tubular support 48. A ring-shaped exhaust path 51 is formed between the tubular support portion 50 and the sidewall 12a.

A ring-shaped baffle plate 52 having a plurality of through-holes is installed in the upper portion of the exhaust path 51. An exhaust device 56 is connected to the lower portion of the exhaust hole 12h through an exhaust pipe 54. The exhaust device 56 includes a vacuum pump such as a turbo molecular pump or the like. The processing space S defined within the processing chamber 12 can be depressurized to a desired vacuum degree by the exhaust device 56.

The stand 14a serves as a high-frequency electrode. A bias high frequency power supply 58 is electrically connected to the stand 14a through a power feeding rod 62 and a matching unit 60. The high frequency power supply 58 outputs a specified high-frequency power having a predetermined frequency, e.g., 13.65 MHz, which is suitable for controlling the energy of ions attracted to a target substrate W. The matching unit 60 accommodates a matcher for matching the impedance at side of the high frequency power supply 58 and the impedance at the side of loads including the electrode, the plasma, the processing chamber 12 and the like. The matcher includes a blocking capacitor for generating a self-bias voltage.

The electrostatic chuck 14c is provided on the upper surface of the stand 14a. The electrostatic chuck 14c holds a target substrate W with an electrostatic attraction force. The focus ring 14b annularly surrounding the target substrate W is provided at the radial outer side of the electrostatic chuck 14c. The electrostatic chuck 14c includes an electrode 14d, and insulation films 14e and 14f. The electrode 14d is formed of a conductive film and is provided between the insulation film 14e and the insulation film 14f. A high-voltage DC power supply 64 is electrically connected to the electrode 14d through a switch 66 and a coated wire 68. The electrostatic chuck 14c can attract and hold the target substrate W with a Coulomb's force generated by a DC voltage applied from the DC power supply 64.

A ring-shaped coolant channel 14g extending in the circumferential direction is provided within the stand 14a. A coolant, e.g., cooling water, having a predetermined temperature is circulated and supplied from a chiller unit (not shown) to the coolant channel 14g through pipes 70 and 72. The temperature of the upper surface of the electrostatic chuck 14c is controlled depending on the temperature of the coolant. A heat transfer gas, e.g., a He gas, is supplied to between the upper surface of the electrostatic chuck 14c and the rear surface of the target substrate W through a gas supply pipe 74. The temperature of the target substrate W is controlled depending on the temperature of the upper surface of the electrostatic chuck 14c. The control signals outputted from the control unit 100 are inputted to the microwave generator 16, the exhaust device 56, the valve 38b, the flow rate controller 38c, the valve 43b, the flow rate controller 43c, the valve 39b, the flow rate controller 39c, the valve 40b, the flow rate controller 40c, the valve 44b, the flow rate controller 44c, the valve 45b and the flow rate controller 45c.

Figure 4:
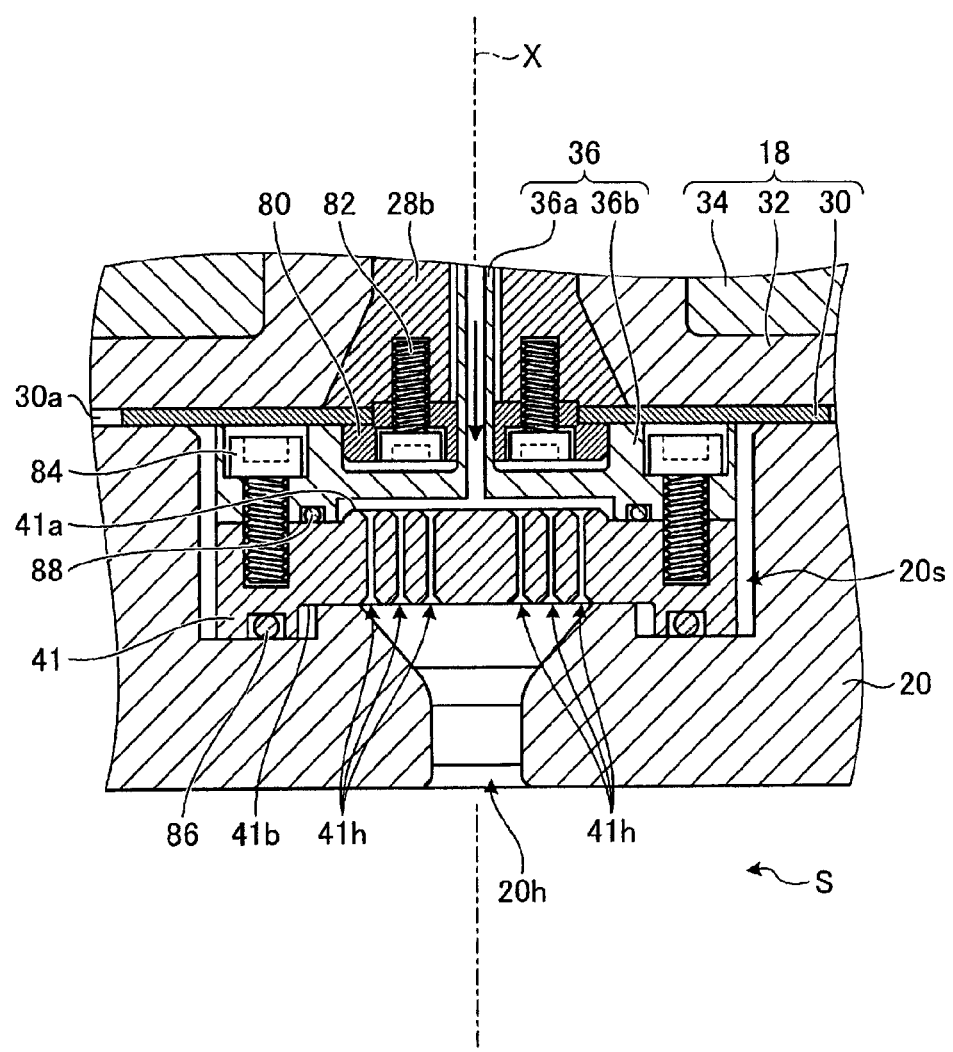
FIG. 4 is a sectional view showing, on an enlarged scale, an injector and a through-hole of a dielectric window according to the embodiment.

Hereinafter, the injector 41 and the through-hole 20h of the dielectric window 20 will be described in more detail with reference to FIG. 4. FIG. 4 is a sectional view showing, on an enlarged scale, the injector and the through-hole of the dielectric window according to the embodiment.

As shown in FIG. 4, the dielectric window 20 includes an accommodation space 20s and a through-hole 20h in order from above along the axis X. The through-hole 20h brings the accommodation space 20s and the processing space S into communication with each other. The through-hole 20h extends along the axis X and is configured such that an area of one portion of the through-hole 20h between an antenna 18 side opening and a processing space S side opening becomes smaller than an area of another portion of the through-hole 20h between the one portion and the antenna 18 side opening. The term "area" used herein refers to the area of the through-hole 20h on a plane orthogonal to the axis X. In one example, as shown in FIG. 4, the through-hole 20h has such a taper shape that the diameter thereof becomes smaller downward along the axis X.

The injector 41 and one end portion 36b of the conduit 36 are accommodated within the accommodation space 20s. The conduit 36 may be made of an electrically conductive material. The conduit 36 includes a body portion 36a and one end portion 36b. The body portion 36a extends along the axis X and has a tubular shape. One end portion 36b has a substantially disc-like shape and has an outer diameter larger than that of the body portion 36a. The conduit 36 is provided with a gas supply internal hole extending through the body portion 36a and one end portion 36b. The body portion 36a of the conduit 36 extends through the internal hole of the inner conductor 28b.

As mentioned above, the inner conductor 28b is connected to the slot plate 30. In the embodiment, the inner edge portion of the slot plate 30 is pinched by the lower end of the inner conductor 28b and a metallic member 80. The member 80 is fixed to the lower end of the inner conductor 28b by screws 82. The upper surface of one end portion 36b of the conduit 36 makes contact with the lower surface of the slot plate 30. In this way, the inner conductor 28b, the slot plate 30 and the conduit 36 are electrically connected to one another.

The injector 41 is accommodated within the accommodation space 20s at the lower side of one end portion 36b of the conduit 36. The injector 41 has electric conductivity and has a substantially disc-like shape. The injector 41 is made of, e.g., aluminum or stainless steel.

The injector 41 includes a first surface 41a at the side of one end portion 36b and a second surface 41b at the side of the through-hole 20h. A plurality of through-holes 41h extending from the first surface 41a to the second surface 41b is formed in the injector 41. In an embodiment, an $Y_2O_3$ film may be formed on the second surface 41b. This film may be formed by coating $Y_2O_3$ on the second surface 41b and then melting the coated film with an electron beam.

The injector 41 is fixed to one end portion 36b of the conduit 36 by screws 84 and is electrically connected to one end portion 36b of the conduit 36. Thus, the injector 41 can be set at the same electric potential as the inner conductor 28b, the slot plate 30 and the conduit 36. The injector 41 may be set at, e.g., a ground potential.

In the embodiment, an O-ring 86 is provided between the second surface 41b of the injector 41 and the dielectric window 20. The O-ring 86 annularly extends to surround the through-hole 20h side openings of the through-holes 41h. By virtue of the O-ring 86, air-tightness is secured between the injector 41 and the dielectric window 20. An O-ring 88 is provided between the first surface 41a of the injector 41 and one end portion 36b of the conduit 36. The O-ring 88 annularly extends to surround the one end portion 36b side openings of the through-holes 41h. Thus, air-tightness is secured between the injector 41 and one end portion 36b of the conduit 36.

In the plasma processing device PM1 configured as above, a gas is supplied from the through-hole 20h of the dielectric window 20 into the processing space S through the conduit 36 and the through-holes 41h of the injector 41 along the axis X. Below the through-hole 20h, a gas is supplied from the gas supply unit 42 toward the axis X. Microwave is introduced from the antenna 18 into the processing space S and/or the through-hole 20h through the dielectric window 20. Thus, plasma is generated in the processing space S and/or the through-hole 20h. In this manner, the plasma processing device PM1 can generate plasma without applying magnetic fields.

Figure 5:
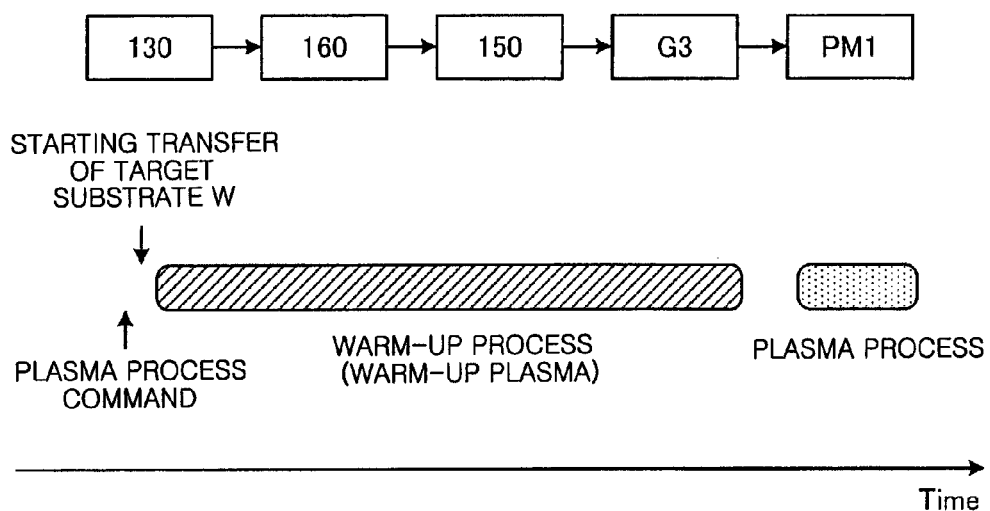
FIG. 5 is a view schematically showing a plasma processing method according to an embodiment.

Next, description will be made on a plasma processing method using the plasma processing device PM1. FIG. 5 is a view schematically showing a plasma processing method according to an embodiment. FIG. 5 shows a sequence of a transfer flow of a target substrate W, a warm-up plasma process and a plasma process. In the example shown in FIG. 5, the target substrate W is transferred from the loading and unloading port 130 to the plasma processing device PM1 and is plasma-processed in the plasma processing device PM1. However, the present invention is not limited thereto.

First, description will be made on the transfer of the target substrate W. As shown in FIG. 5, the target substrate W is placed at the loading and unloading port 130. If a command is issued to start a plasma process for the target substrate W placed at the loading and unloading port 130, the control unit 100 starts the transfer of the target substrate W. The control unit 100 transfers the target substrate W from the loading and unloading port 130 to the alignment module 160 through the door 140 and the atmospheric transfer chamber 11. The alignment module 160 performs a process of adjusting the position of the target substrate W.

Subsequently, the control unit 100 transfers the position-adjusted target substrate W from the alignment module 160 to the load-lock chamber 150 through the gate valve G1. After the target substrate W is transferred, the load-lock chamber 150 is depressurized to a vacuum pressure. Then, the control unit 100 transfers the target substrate W from the load-lock chamber 150 kept under a vacuum pressure to the plasma processing device PM1 through the gate valve G2, the vacuum transfer chamber 13 and the gate valve G3. The plasma processing device PM1 performs a plasma process, e.g., an etching process, with respect to the target substrate W thus transferred.

Next, description will be made on a warm-up process of the control unit 100. As shown in FIG. 5, if the transfer of the target substrate W is started pursuant to a command of starting a plasma process for the target substrate W placed at the loading and unloading port 130, the control unit 100 performs a warm-up process. The warm-up process refers to a process (warm-up plasma process) in which, during the transfer of the target substrate W, a processing gas is supplied into the processing space S by a gas supply mechanism and electromagnetic energy is supplied into the processing space S by a plasma generation mechanism in a state (wafer-less state) where the target substrate W is not mounted on the stage 14.

The control unit 100 finishes the warm-up process when the target substrate W reaches the gate valve G3 installed in front of the plasma processing device PM1 but before the target substrate W is transferred to the plasma processing device PM1. After the target substrate W is transferred to the plasma processing device PM1 and is mounted on the stage 14, the plasma processing device PM1 performs a process (plasma process) in which, for the purpose of, e.g., an etching process, a processing gas is supplied into the processing space S by a gas supply mechanism and electromagnetic energy is supplied into the processing space S by a plasma generation mechanism.

Figure 6:
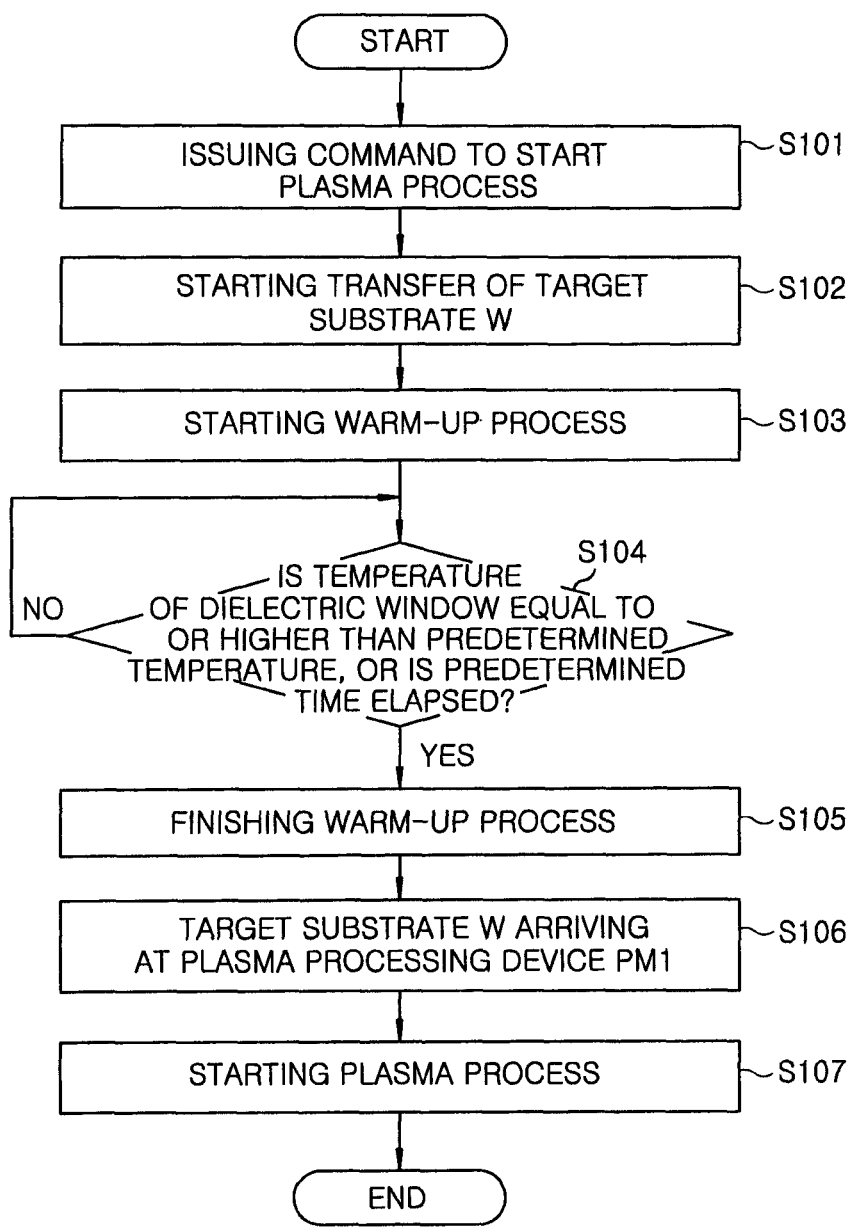
FIG. 6 is a flowchart illustrating the plasma processing method according to the embodiment.

In the embodiment described above, there is illustrated an example where the warm-up process is finished after the target substrate W has reached the gate valve G. However, the present invention is not limited thereto. FIG. 6 is a flowchart illustrating the plasma processing method according to the embodiment.

As shown in FIG. 6, if a command to start a plasma process for the target substrate W placed at the loading and unloading port 130 is issued (S101), the control unit 100 starts the transfer of the target substrate W placed at the loading and unloading port 130 (S102). Subsequently, if the transfer of the target substrate W is started, the control unit 100 starts a warm-up process (S103). Then, the control unit 100 determines whether the temperature of the central portion of, e.g., the facing surface 20a of the dielectric window 20 is equal to or higher than a predetermined temperature or whether a predetermined time is elapsed (S104).

The control unit 100 continues to perform the warm-up process until the temperature of the central portion of, e.g., the facing surface 20a of the dielectric window 20 becomes the predetermined temperature or higher or until the predetermined time is elapsed (if No in S104). On the other hand, the control unit 100 finishes the warm-up process (S105) if the temperature of the central portion of, e.g., the facing surface 20a of the dielectric window 20 becomes the predetermined temperature or higher or if the predetermined time is elapsed (if Yes in S104).

Subsequently, if the target substrate W arrives at the plasma processing device PM1 (the stage 14) (S106), the control unit 100 starts a plasma process such as plasma etching or the like (S107).

According to the plasma processing device PM1 and the plasma processing method of the embodiment, the warm-up process is performed while the target substrate W is being transferred to the plasma processing device PM1 pursuant to the command for starting the plasma process of the target substrate W. Therefore, even if the target substrate W belongs to the first lot, the temperature of, e.g., the dielectric window 20 of the plasma processing device PM1 is increased to a desired temperature at the time when the plasma process is performed with respect to the target substrate W of the first lot. In addition, the warm-up process is performed during the transfer of the target substrate W. Thus, the throughput is hardly affected by the warm-up process. As a result, according to the plasma processing device PM1 and the plasma processing method of the embodiment, it is possible to suppress a reduction in the etching rate of the target substrate W of the first lot and to suppress a reduction in the throughput of the plasma process of the target substrate W.

Figure 7A:
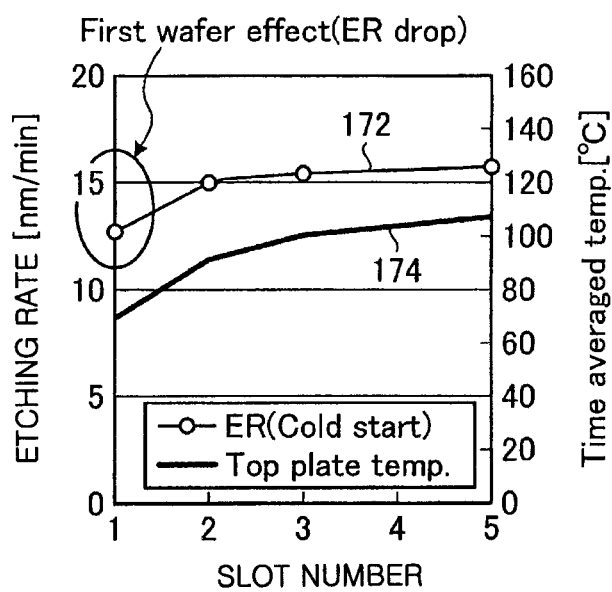
FIG. 7A is a view for explaining the effect obtained by the plasma processing method according to the embodiment.
Figure 7B:
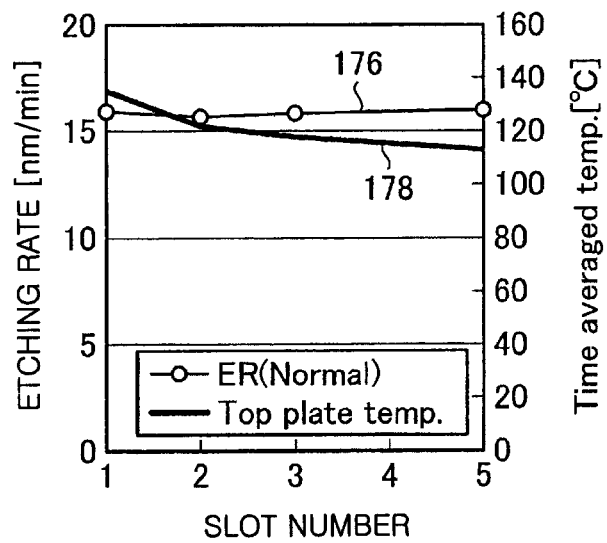
FIG. 7B is a view for explaining the effect obtained by the plasma processing method according to the embodiment.
Figure 7C:
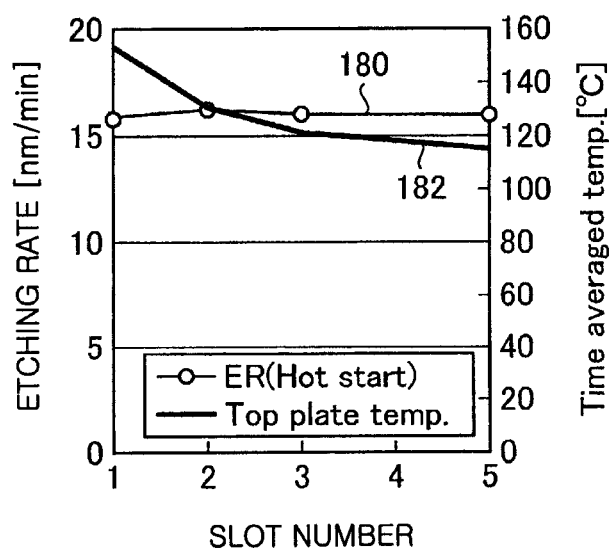
FIG. 7C is a view for explaining the effect obtained by the plasma processing method according to the embodiment.

Next, description will be made on the effects obtained by the plasma processing method according to the embodiment. FIGS. 7A, 7B and 7C are views for explaining the effects obtained by the plasma processing method according to the embodiment. FIGS. 7A, 7B and 7C are views illustrating the effects of the plasma processing method according to the embodiment.

In FIGS. 7A, 7B and 7C, the horizontal axis indicates the number (slot number) denoting the processing order of target substrates W transferred into the plasma processing device PM1 in one lot. The vertical axis indicates the etching rate (nm/min) and the time averaged temperature (° C.) of the dielectric window 20. FIG. 7A is a graph representing the relationship between the temperature of the dielectric window 20 and the etching rate in case where a plasma etching process is performed with respect to the target substrate W without using the plasma processing method according to the embodiment. FIGS. 7B and 7C are graphs representing the relationship between the temperature of the dielectric window 20 and the etching rate in case where a plasma etching process is performed with respect to the target substrate W using the plasma processing method according to the embodiment.

Referring first to FIG. 7A, when the plasma processing method according to the embodiment was not used, as indicated by a curve 174, the temperature of the dielectric window 20 when processing the target substrate W of slot number "1" was lower than the temperature of the dielectric window 20 when processing the target substrates W of other slot numbers. Furthermore, as indicated by a curve 172, the etching rate of the target substrate W of slot number "1" was lower than the etching rates of the target substrates W of other slot numbers. This is called a "first wafer effect" which refers to a phenomenon that the etching rate of the target substrate W of slot number "1" is reduced due to the low temperature of the dielectric window 20 (and the processing space S) when processing the target substrate W of slot number "1".

In contrast, when the plasma processing method according to the embodiment was used, the warm-up process was performed while the target substrate W was being transferred to the plasma processing device PM1 pursuant to the command for starting the plasma process of target substrate W. As a result, as indicated by a curve 178 in FIG. 7B, the temperature of the dielectric window 20 when processing the target substrate W of slot number "1" was equal to or a little higher than the temperature of the dielectric window 20 when processing the target substrates W of other slot numbers. In this way, according to the plasma processing method of the embodiment, it is possible to keep high the temperature of the dielectric window 20 (and the processing space S) when processing the target substrate W of slot number "1". As a result, as indicated by a curve 176, the etching rate of the target substrate W of slot number "1" could be kept substantially equal to the etching rates of the target substrates W of other slot numbers.

FIG. 7C is a graph representing the relationship between the temperature of the dielectric window 20 and the etching rate in case where the warm-up process was performed for a longer time than in FIG. 7B. As indicated by a curve 182 in FIG. 7C, when processing the target substrate W of slot number "1", the temperature of the dielectric window 20 was significantly higher than the temperature of the dielectric window 20 when processing the target substrates W of other slot numbers. In this way, according to the plasma processing method of the embodiment, it is possible to keep high the temperature of the dielectric window 20 (and the processing space S) when processing the target substrate W of slot number "1". As a result, as indicated by a curve 180, the etching rate of the target substrate W of slot number "1" could be kept substantially equal to the etching rates of the target substrates W of other slot numbers.

When performing the warm-up process, the control unit 100 may cause a gas supply mechanism to supply a processing gas including oxygen gas into the processing space S. Moreover, when performing the warm-up process, the control unit 100 may cause a gas supply mechanism to first supply a first processing gas including a fluorine-based gas into the processing space S and then to supply a second processing gas including oxygen gas into the processing space S. In this regard, description will be made herein below.

Figure 8:
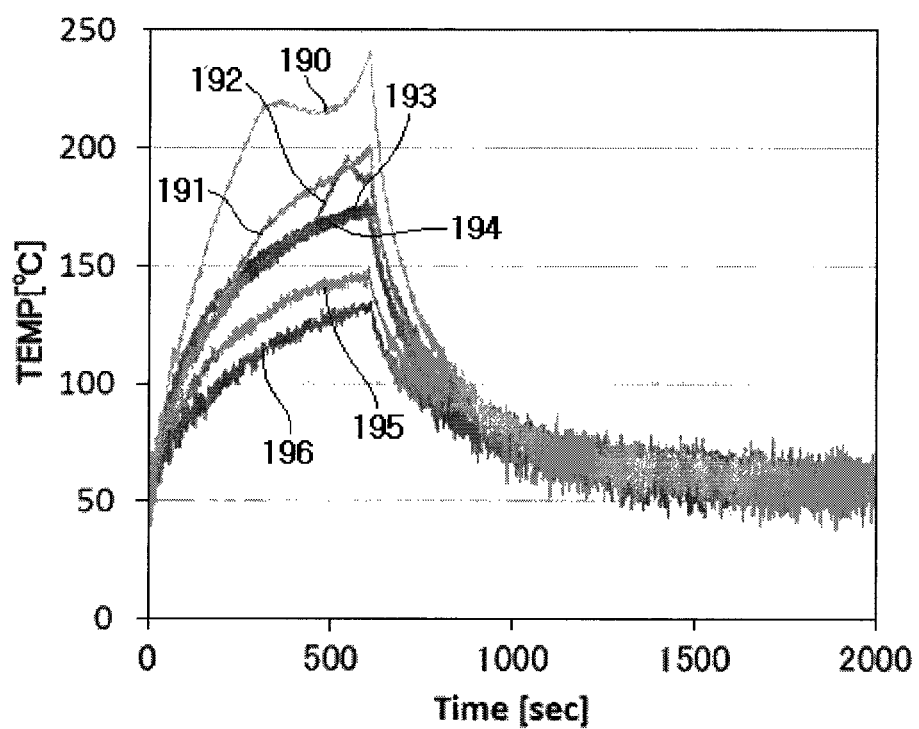
FIG. 8 is a view showing the changes in the temperature of a dielectric window for each type of processing gases in the plasma processing method according to the embodiment.

FIG. 8 is a view showing changes in the temperature of the dielectric window for each type of processing gases in the plasma processing method according to the embodiment. In FIG. 8, the horizontal axis indicates the time (sec) elapsed from the start of the warm-up process. The vertical axis indicates the temperature (C) of the dielectric window 20.

In FIG. 8, the curve 190 indicates the change in the temperature of the dielectric window 20 in case where, as the processing gases of the warm-up process, $SF_6$ gas (150 sccm), which is a fluorine-based gas, and $O_2$ gas (50 sccm) were supplied into the processing space S. The curve 191 indicates the change in the temperature of the dielectric window 20 in case where, as the processing gases of the warm-up process, $SF_6$ gas (100 sccm) and $O_2$ gas (100 sccm) were supplied into the processing space S. The curve 192 indicates the change in the temperature of the dielectric window 20 in case where, as the processing gases of the warm-up process, $SF_6$ gas (50 sccm) and $O_2$ gas (150 sccm) were supplied into the processing space S.

The curve 193 indicates the change in the temperature of the dielectric window 20 in case where, as the processing gas of the warm-up process, $O_2$ gas (200 sccm) was supplied into the processing space S. The curve 194 indicates the change in the temperature of the dielectric window 20 in case where, as the processing gas of the warm-up process, $O_2$ gas (350 sccm) was supplied into the processing space S.

The curve 195 indicates the change in the temperature of the dielectric window 20 in case where, as the processing gas of the warm-up process, Ar gas (200 sccm) was supplied into the processing space S. The curve 196 indicates the change in the temperature of the dielectric window 20 in case where, as the processing gases of the warm-up process, Ar gas (150 sccm) and $O_2$ gas (50 sccm) were supplied into the processing space S.

The time required for the temperature of the dielectric window 20 to reach 150° C. was 147 sec in case where the $SF_6$ gas (150 sccm) and the $O_2$ gas (50 sccm) were supplied as the processing gases (the curve 190). The time required for the temperature of the dielectric window 20 to reach 150° C. was 246 sec in case where the $SF_6$ gas (100 sccm) and the $O_2$ gas (100 sccm) were supplied as the processing gases (the curve 191).

The time required for the temperature of the dielectric window 20 to reach 150° C. was 264 sec in case where the $O_2$ gas (200 sccm) was supplied as the processing gas (the curve 193). The time required for the temperature of the dielectric window 20 to reach 150° C. was 283 sec in case where the $SF_6$ gas (50 sccm) and the $O_2$ gas (150 sccm) were supplied as the processing gases (the curve 192).

The time required for the temperature of the dielectric window 20 to reach 150° C. was 299 sec in case where the $O_2$ gas (350 sccm) was supplied as the processing gas (the curve 194). The temperature of the dielectric window 20 failed to reach 150° C. in case where the Ar gas (200 sccm) was supplied as the processing gas (the curve 195) and in case where the Ar gas (150 sccm) and the $O_2$ gas (50 sccm) were supplied as the processing gases (the curve 196).

As can be noted from these results and FIG. 8, the temperature rise of the dielectric window 20 due to the warm-up process becomes faster when the $O_2$ gas is used as the processing gas than when the Ar gas is used as the processing gas. For that reason, in the embodiment, as the processing gas for the warm-up process, a processing gas including oxygen gas may be supplied into the processing space S.

As can be noted from these results and FIG. 8, the temperature rise of the dielectric window 20 due to the warm-up process becomes faster as the concentration of the $SF_6$ gas grows higher. In case where plasma is generated using the $SF_6$ gas in the warm-up process, it is preferred that the inside of the processing chamber 12 is cleaned prior to subsequently performing a plasma process such as etching or the like. For that reason, in the embodiment, as the processing gas for the warm-up process, a first processing gas including a fluorine-based gas may be first supplied into the processing space S and then a second processing gas including oxygen gas may be supplied into the processing space S. This makes it possible to rapidly increase the temperature of the dielectric window 20 in the warm-up process and to clean the inside of the processing chamber 12 prior to the plasma process.

Figure 9:
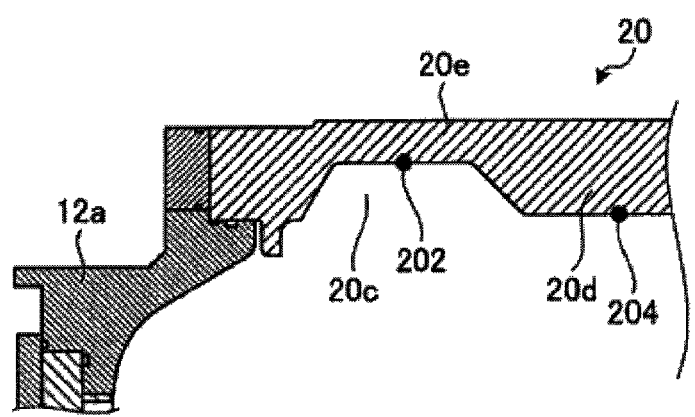
FIG. 9 is a view illustrating one example of measurement points of the temperature of the dielectric window.
Figure 10:
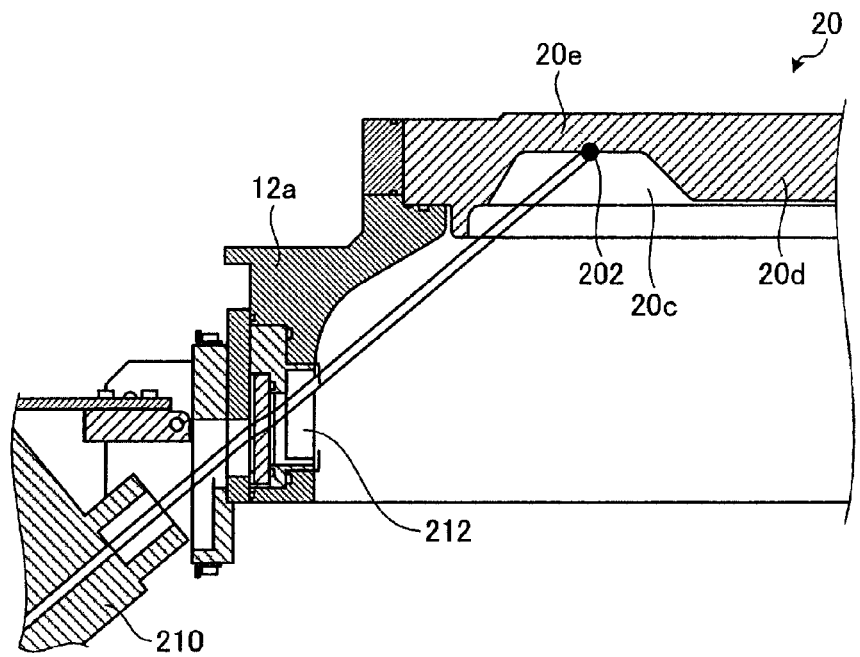
FIG. 10 is a view illustrating one example of the temperature measurement using a radiation thermometer.
Figure 11:
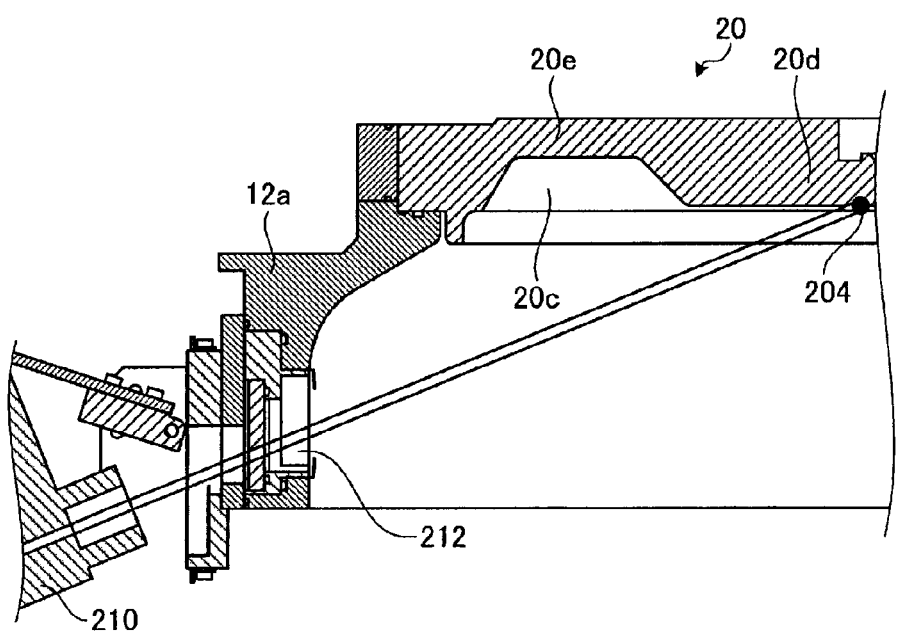
FIG. 11 is a view illustrating another example of the temperature measurement using the radiation temperature measuring instrument.

Next, description will be made on the measurement of the temperature of the dielectric window 20. FIG. 9 is a view illustrating one example of measurement points of the temperature of the dielectric window. FIGS. 10 and 11 are views illustrating one example of the temperature measurement using a radiation temperature measuring instrument.

As shown in FIG. 9, the measurement points of the temperature of the dielectric window 20 may include a point 202 on an inner surface of the thin portion 20e provided by the recess portion 20c of the dielectric window 20 and a point 204 on an inner surface of the thick portion 30d of the central portion of the dielectric window 20.

In case where the temperature of the point 202 is measured, as shown in FIG. 10, a radiation thermometer 210 is installed outside the sidewall 12a. Then, the radiation thermometer 210 measures radiation energy such as infrared rays or the like, which is emitted from the measurement point 202, through a measurement window 212 provided in the sidewall 12a, thereby measuring the surface temperature of the measurement point 202.

In case where the temperature of the point 204 is measured, as shown in FIG. 11, the installation angle of the radiation thermometer 210 is adjusted. Then, the radiation thermometer 210 measures radiation energy such as infrared rays or the like, which is emitted from the measurement point 204, through the measurement window 212 provided in the sidewall 12a, thereby measuring the surface temperature of the measurement point 204.

Figure 12:
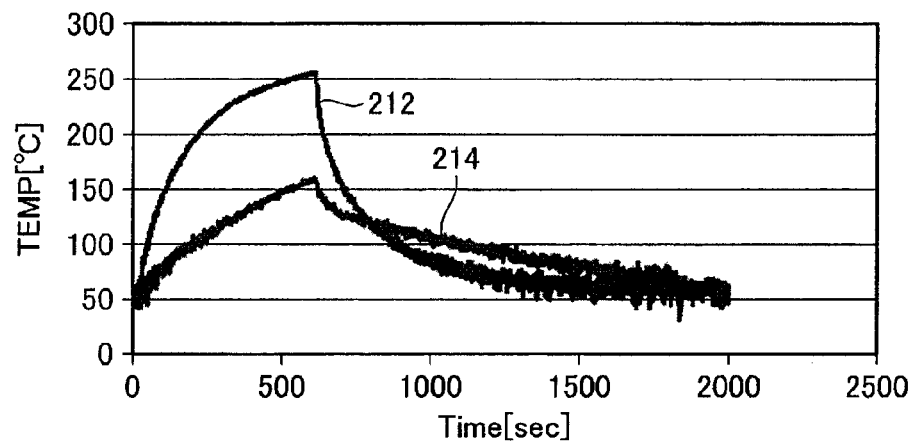
FIG. 12 is a view illustrating the change in the temperature at each of the temperature measurement points of the dielectric window.

Next, description will be made on the change of the temperature of the dielectric window 20 in case where the temperatures of the point 202 and the point 204 are measured. FIG. 12 is a view showing the change in the temperature at each of the temperature measurement points of the dielectric window. In FIG. 12, the horizontal axis indicates the time (sec) elapsed from the start of the warm-up process. The vertical axis indicates the temperature (C) of the dielectric window 20.

In FIG. 12, the curve 212 indicates the change in the temperature of the measurement point 202. The curve 214 indicates the change in the temperature of the measurement point 204. As shown in FIG. 12, after the warm-up process is started, the temperature of the measurement point 202, i.e., the temperature of the thin portion 20e of the dielectric window 20, is sharply increased first. The temperature of the measurement point 204, i.e., the temperature of the thick portion 20d of the dielectric window 20, is gently increased.

In this regard, even if the temperature of the thin portion 20e reaches a predetermined temperature (e.g., 150° C.), the phenomenon (first wafer effect) that the etching rate of the target substrate W of an initial lot, e.g., the first lot, becomes low may be generated in case where the temperature of the thick portion 20d of the central portion of the dielectric window 20 does not reach the predetermined temperature (e.g., 150° C.). In other words, in case where the temperature of the measurement point 202 corresponding to the thin portion 20e is measured and the warm-up process is finished because the measured temperature reaches the predetermined temperature, there is a fear that the first wafer effect is generated due to the failure to sufficiently heating the thick portion 20d of the dielectric window 20. For that reason, in the embodiment, it is preferred that the temperature of the thick portion 20d of the dielectric window 20 is measured using the radiation thermometer 210 and that the control unit 100 performs the warm-up process until the temperature of the thick portion 20d of the dielectric window 20 measured by the radiation thermometer 210 becomes equal to or higher than the predetermined temperature (e.g., 150° C.).

Figure 13:
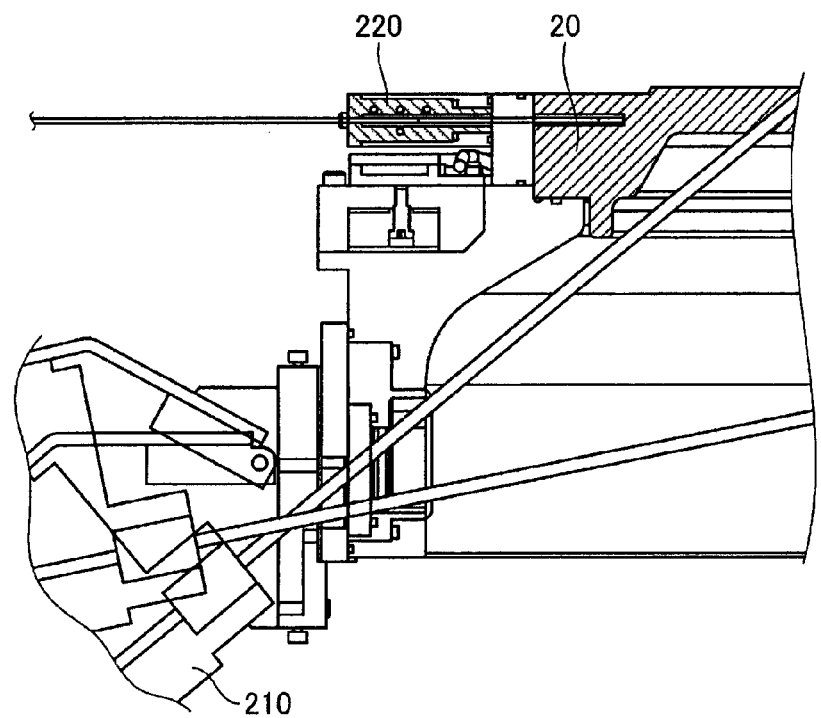
FIG. 13 is a view illustrating one example of the temperature measurement using an optical fiber thermometer.

The instrument for measuring the temperature of the dielectric window 20 is not limited to the radiation thermometer 210. For example, it may be possible to use an optical fiber thermometer. FIG. 13 is a view illustrating one example of the temperature measurement using an optical fiber thermometer.

As shown in FIG. 13, an optical fiber thermometer 220 is installed to measure temperature in the peripheral portion of the dielectric window 20 from the outside of the processing chamber 12. As described above, the transition of temperature rise of the dielectric window 20 differs in the central portion and the peripheral portion of the facing surface 20a. In order to suppress the first wafer effect, it is preferred that the warm-up process is performed while measuring the temperature of the central portion.

However, the temperature of the dielectric window 20 may be measured with a simplified configuration by, e.g., finding the correlation between the temperatures of the central portion and the peripheral portion of the dielectric window 20 through a preliminary experiment or simulation. The correlation of the temperatures refers to, e.g., a temperature relationship in which, if the temperature of the peripheral portion of the dielectric window 20 is increased to a certain temperature (e.g., 250° C.), the temperature of the central portion of the facing surface 20a of the dielectric window 20 can be regarded as having been increased to a desired temperature (e.g., 150° C.).

For that reason, it is preferred that the control unit 100 performs the warm-up process until the temperature of the peripheral portion of the dielectric window 20 measured by the optical fiber thermometer 220 becomes equal to or higher than a predetermined temperature which is set based on the correlation between the temperature of the peripheral portion of the dielectric window 20 measured by the optical fiber thermometer 220 and the temperature of the central portion of the facing surface 20a of the dielectric window 20.

This makes it possible to simplify the temperature measurement configuration, because the temperature of the peripheral portion of the dielectric window 20 can be measured at the atmosphere side by the optical fiber thermometer 220 without having to measure the temperature of the central portion of the facing surface 20a of the dielectric window 20 with the radiation thermometer 210.

Figure 14A:
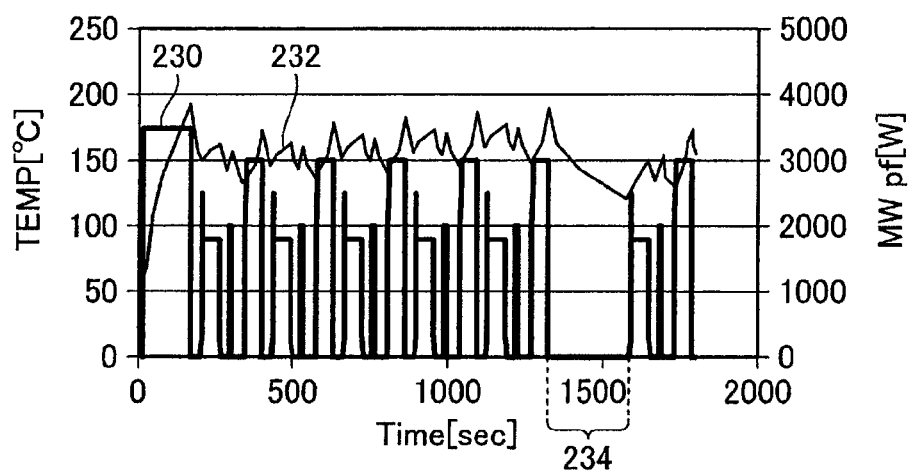
FIG. 14A is a view showing the changes in the temperature of a dielectric window between lots.
Figure 14B:
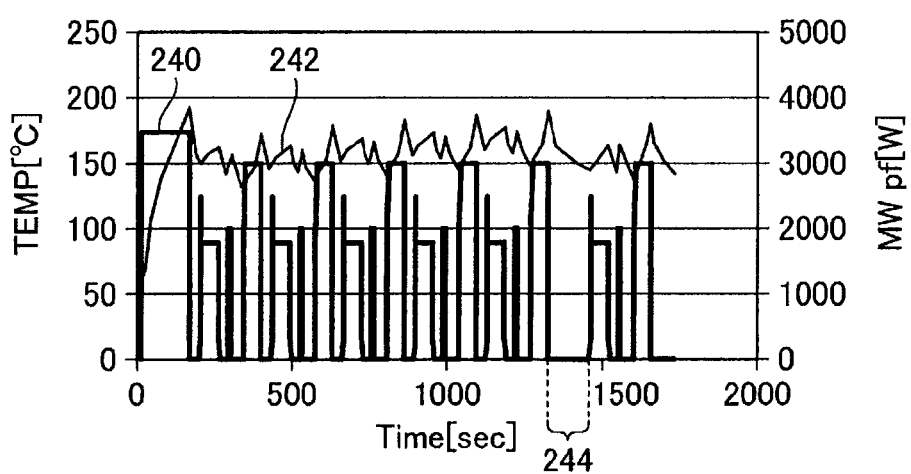
FIG. 14B is a view showing the changes in the temperature of a dielectric window between lots.

Next, description will be made on an inter-lot warm-up process. FIGS. 14A and 14B are views showing a change in the temperature of the dielectric window between lots. In FIGS. 14A and 14B, the horizontal axis indicates the time (sec) elapsed. The vertical axis indicates the temperature (° C.) of the dielectric window 20 and the power (W) of microwave. FIG. 14A shows the change in the temperature of the dielectric window in case where the time between lots is relatively long. FIG. 14B shows the change in the temperature of the dielectric window in case where the time between lots is relatively short. In FIG. 14A, the curve 230 indicates the change in the power of microwave. The curve 232 indicates the change in the temperature of the dielectric window 20. In FIG. 14B, the curve 240 indicates the change in the power of microwave. The curve 242 indicates the change in the temperature of the dielectric window 20.

As indicated by the curve 230 in FIG. 14A, if the lot exchange time 234 is relatively long after performing the plasma process for an initial lot, the temperature of the dielectric window 20 sharply decreases. In this case, the average of the etching rates of the target substrates W of the initial lot (first lot) was 15.8 nm/min, whereas the average of the etching rates of the target substrates W of the exchanged lot (second lot) was sharply reduced to 14.6 nm/min.

On the other hand, as indicated by the curve 240 in FIG. 14B, if the lot exchange time 244 is relatively short after performing the plasma process for an initial lot, the reduction in the temperature of the dielectric window 20 is relatively small. In this case, the average of the etching rates of the target substrates W of the initial lot (first lot) was 15.4 nm/min, whereas the average of the etching rates of the target substrates W of the exchanged lot (second lot) was 15.3 nm/min. In this way, if the lot exchange time is relatively short and if the reduction in the temperature of the dielectric window 20 is relatively small, the reduction in the etching rate of the target substrate W is relatively small.

In other words, if the lot exchange time is long, the reduction in the temperature of the dielectric window 20 becomes relatively large and the etching rate of the target substrate W of the exchanged lot decreases. Thus, the warm-up process between lots (the inter-lot warm-up process) is effective. The inter-lot warm-up process refers to a process in which, during the time between the first lot and the second lot, a processing gas is supplied into the processing space S by a gas supply mechanism and electromagnetic energy is supplied into the processing space S by a plasma generation mechanism in a state (wafer-less state) where the target substrate W is not mounted on the stage 14.

Figure 15:
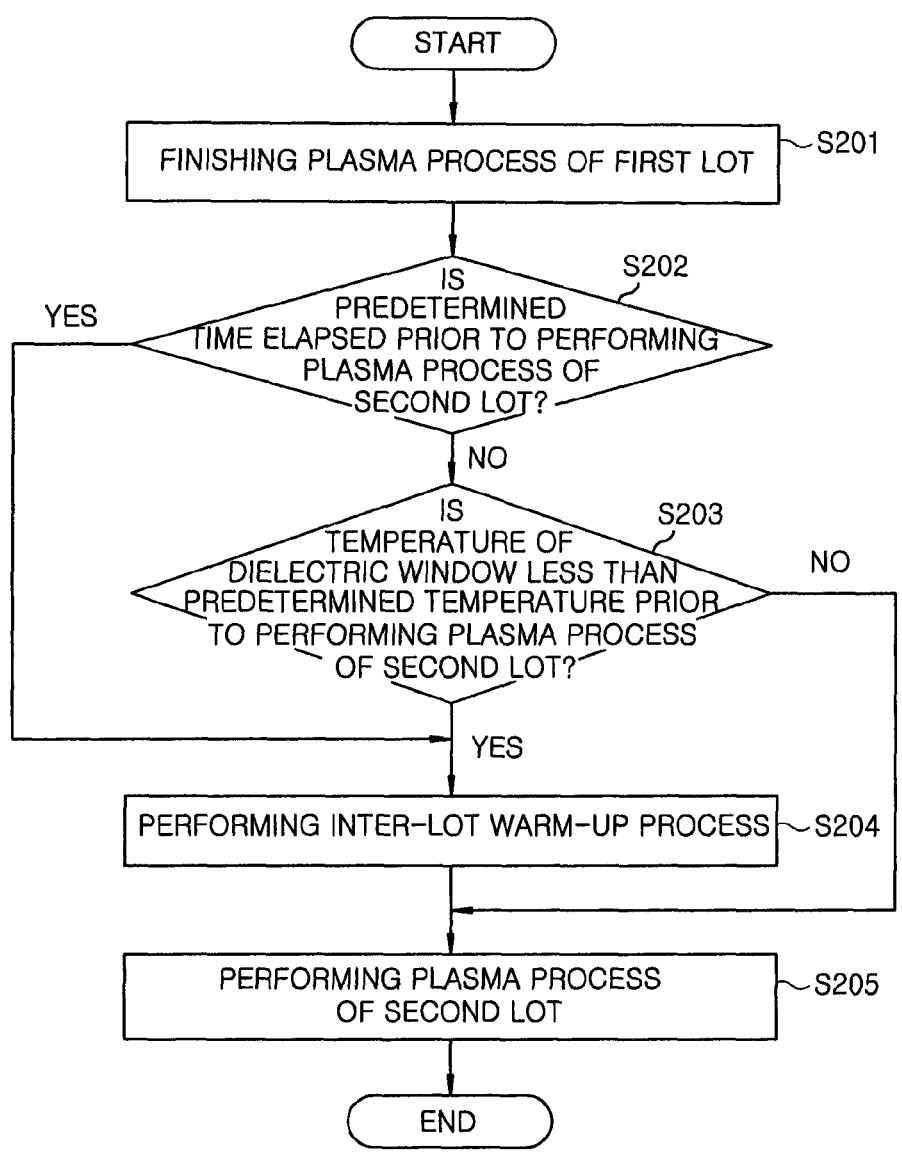
FIG. 15 is a flowchart illustrating an inter-lot warm-up process according to an embodiment.

FIG. 15 is a flowchart illustrating an inter-lot warm-up process according to an embodiment. As shown in FIG. 15, if a plasma process for the first lot is finished (S201), the control unit 100 determines whether a predetermined time is elapsed prior to performing a plasma process with respect to the second lot (S202).

If it is determined that the predetermined time is not elapsed prior to performing the plasma process with respect to the second lot (if No in S202), the control unit 100 determines whether the temperature of the dielectric window is less than a predetermined temperature prior to performing the plasma process with respect to the second lot (S203).

If it is determined that the predetermined time is elapsed prior to performing the plasma process with respect to the second lot (if Yes in S202) or if it is determined that the temperature of the dielectric window 20 is less than the predetermined temperature prior to performing the plasma process with respect to the second lot (if Yes in S203), the control unit 100 starts an inter-lot warm-up process (S204). After finishing the inter-lot warm-up process, the control unit 100 performs a plasma process with respect to the second lot (S205).

In this way, during the time between the first lot and the second lot, if the predetermined time is lapsed or if the temperature of the dielectric window 20 is less than the predetermined temperature, the inter-lot warm-up process is performed. Accordingly, it is possible to prevent the temperature of the inner surface of the processing chamber (the dielectric window 20) from decreasing during the lot exchange time between the first lot and the second lot. This makes it possible to suppress a reduction in the etching rate of the target substrate W of the exchanged lot.

According to the plasma processing device PM1 of the present embodiment, the warm-up process is performed while the target substrate W is being transferred to the plasma processing device PM1 pursuant to a command for starting the plasma process of the target substrate W. Therefore, even if the target substrate W belongs to the first lot, the temperature of, e.g., the dielectric window 20 of the plasma processing device PM1 is increased to a desired temperature at the time when the plasma process is performed with respect to the target substrate W of the first lot. In addition, since the warm-up process is performed during the transfer of the target substrate W, the throughput is hardly affected. As a result, according to the plasma processing device PM1 and the plasma processing method of the embodiment, it is possible to suppress a reduction in the etching rate of the target substrate W of the first lot and to suppress a reduction in the throughput of the plasma process of the target substrate W.

According to the plasma processing device PM1 of the present embodiment, a processing gas including oxygen gas is used when performing the warm-up process. It is therefore possible to rapidly increase the temperature of the dielectric window 20. When performing the warm-up process, the plasma processing device PM1 of the present embodiment supplies a first processing gas including a fluorine-based gas into the plasma processing space and then supplies a second processing gas including oxygen gas into the plasma processing space. Therefore, according to the plasma processing device PM1 of the present embodiment, it is possible to rapidly increase the temperature of the dielectric window 20 with the first processing gas and to clean the processing chamber 12 with the second processing gas.

When exchanging the lots, the plasma processing device PM1 of the present embodiment performs the inter-lot warm-up process if a predetermined time is elapsed or if the temperature of the dielectric window 20 is less than a predetermined temperature. By the inter-lot warm-up process, it is possible to suppress a reduction in the temperature of the dielectric window 20 when exchanging the lots. This makes it possible to suppress a reduction in the etching rate of the target substrate W of the exchanged lot.

Description of Reference Symbols

| | |
|---|---|
| 12: processing chamber | 14: stage |
| 16: microwave generator | 18: antenna |
| 20a: facing surface | 20d: thick portion |
| 20e: thin portion | 20: dielectric window |
| 30: slot plate | |
| 38, 39, 40, 43, 44, 45: gas supply system | |
| 100: control unit | 120: transfer mechanism |
| 130: loading and unloading port | 150: load-lock chamber |
| 160: alignment module | 210: radiation thermometer |
| 220: optical fiber thermometer | |
| PM1: plasma processing device | |

What is claimed is:

1. A plasma processing device, comprising:
a processing chamber configured to define a plasma processing space;
a substrate mounting stage provided within the processing chamber such that a target substrate is mounted on the substrate mounting stage;
a gas supply mechanism configured to introduce a processing gas to be used in a plasma reaction into the plasma processing space;
a plasma generation mechanism configured to supply electromagnetic energy for converting the processing gas introduced into the plasma processing space to plasma; and
a control unit configured to perform, while the target substrate is transferred from a loading and unloading port to the processing chamber in response to a command to start a plasma process for the target substrate mounted on the loading and unloading port outside the processing chamber, a warm-up process of the processing chamber by supplying the processing gas into the plasma processing space by the gas supply mechanism and supplying the electromagnetic energy by the plasma generation mechanism in a state where no target substrate is mounted on the substrate mounting stage,
wherein the plasma generation mechanism includes a microwave generator, a disc-shaped dielectric body having a facing surface which faces the plasma processing space, and an antenna provided on an opposite surface of the disc-shaped dielectric body to the facing surface and configured to radiate a plasma excitation microwave toward the plasma processing space through the disc-shaped dielectric body based on a microwave generated by the microwave generator,
wherein the disc-shaped dielectric body has an annular recess portion formed between a central portion and an outer peripheral portion of the facing surface, and
wherein the processing device further comprises a temperature sensor for sensing a temperature of a peripheral portion of the disc-shaped dielectric body; and
wherein the control unit is configured to:
(i) perform the warm-up process until the temperature of the peripheral portion of the disc-shaped dielectric body measured by the temperature sensor becomes equal to or higher than a first predetermined temperature, (ii) determine a temperature relationship between the peripheral portion of the disc-shaped dielectric body and the central portion of the disc-shaped dielectric body such that when the temperature of the peripheral portion reaches the first predetermined temperature, the temperature of the central portion reaches a second predetermined temperature, and (iii) discontinue the warm up process after the temperature sensor senses the first predetermined temperature has been reached and, based on the temperature relationship, the second predetermined temperature has been reached.

2. The plasma processing device of claim 1, wherein:
the temperature sensor is an optical fiber thermometer configured to measure a temperature of a peripheral portion of the disc-shaped dielectric body from the outside of the processing chamber.

3. The plasma processing device of claim 1, wherein the processing gas includes oxygen gas, and
wherein the control unit is configured to supply the processing gas including the oxygen gas into the plasma processing space by the gas supply mechanism.

4. The plasma processing device of claim 1, wherein the processing gas includes a first processing gas including a fluorine-based gas and a second processing gas including oxygen gas, and
wherein the control unit is configured to supply the first processing gas into the plasma processing space by the gas supply mechanism and then to supply the second processing gas into the plasma processing space by the gas supply mechanism.

5. The plasma processing device of claim 1, wherein the control unit is configured to perform, in response to a determination that a predetermined time has elapsed or that a temperature of a predetermined portion of the plasma processing device has dropped down to a third predetermined temperature after performing a plasma process for a target substrate of a first lot and before performing a plasma process for a target substrate of the next lot, an inter-lot warm-up process of the processing chamber by supplying the processing gas into the plasma processing space by the gas supply mechanism and supplying the electromagnetic energy by the plasma generation mechanism in a state where no target substrate is mounted on the substrate mounting stage.

6. The plasma processing device of claim 2, wherein the processing gas includes oxygen gas, and
wherein the control unit is configured to supply the processing gas including the oxygen gas into the plasma processing space by the gas supply mechanism.

7. The plasma processing device of claim 2, wherein the processing gas includes a first processing gas including a fluorine-based gas and a second processing gas including oxygen gas, and wherein the control unit is configured to supply the first processing gas into the plasma processing space by the gas supply mechanism and then to supply the second processing gas into the plasma processing space by the gas supply mechanism.

8. The plasma processing device of claim 2, wherein the control unit is configured to perform, in response to a determination that a predetermined time has elapsed or that a temperature of a predetermined portion of the plasma processing device has dropped down to a third predetermined temperature after performing a plasma process for a target substrate of a first lot and before performing a plasma process for a target substrate of the next lot, an inter-lot warm-up process of the processing chamber by supplying the processing gas into the plasma processing space by the gas supply mechanism and supplying the electromagnetic energy by the plasma generation mechanism in a state where no target substrate is mounted on the substrate mounting stage.

9. A plasma processing method, the method comprising:
providing the plasma processing device of claim 1;
while a target substrate is transferred from the loading and unloading port to the processing chamber in response to a command to start a plasma process for the target substrate mounted on a loading and unloading port outside the processing chamber, performing a warmup process by supplying the processing gas into the plasma processing space by the gas supply mechanism and supplying the electromagnetic energy by the plasma generation mechanism in a state where no target substrate is mounted on the substrate mounting stage; and wherein the method further comprises:
(i) performing the warm-up process until the temperature of the peripheral portion of the disc-shaped dielectric body measured by the temperature sensor becomes equal to or higher than a first predetermined temperature, (ii) determining a temperature relationship between the peripheral portion of the disc-shaped dielectric body and the central portion of the disc-shaped dielectric body such that when the temperature of the peripheral portion reaches the first predetermined temperature, the temperature of the central portion reaches a second predetermined temperature, and (iii) discontinuing the warm up process after the temperature sensor senses the first predetermined temperature has been reached and, based on the temperature relationship, the second predetermined temperature has been reached.

* * * * *